US009208924B2

(12) United States Patent
Boss et al.

(10) Patent No.: US 9,208,924 B2
(45) Date of Patent: Dec. 8, 2015

(54) ELECTRICALLY CONDUCTIVE ELEMENT, SYSTEM, AND METHOD OF MANUFACTURING

(75) Inventors: Daniel Boss, Lake Villa, IL (US); Scott Qualls, Chicago, IL (US); David McDonald, Glenview, IL (US); Terrance Z. Kaiserman, Loxahatchee, FL (US); Keith J. Margolin, West Palm Beach, FL (US); Michael Wassief, Boynton Beach, FL (US); Liang Chai, Stuart, FL (US)

(73) Assignee: T+ink, Inc., New York, NY (US)

( * ) Notice: Subject to any disclaimer, the term of this patent is extended or adjusted under 35 U.S.C. 154(b) by 545 days.

(21) Appl. No.: 12/552,487

(22) Filed: Sep. 2, 2009

(65) Prior Publication Data
US 2010/0156196 A1 Jun. 24, 2010

Related U.S. Application Data

(60) Provisional application No. 61/093,789, filed on Sep. 3, 2008.

(51) Int. Cl.
*H01B 7/30* (2006.01)
*H01B 5/02* (2006.01)
*H01R 25/14* (2006.01)
(Continued)

(52) U.S. Cl.
CPC ............... *H01B 5/02* (2013.01); *H01R 25/147* (2013.01); *H05K 3/103* (2013.01); *H01B 13/165* (2013.01); *H01R 4/2404* (2013.01); *H05K 2201/09672* (2013.01); *H05K 2201/09963* (2013.01); *Y10T 29/49117* (2015.01); *Y10T 29/49155* (2015.01); *Y10T 307/74* (2015.04)

(58) Field of Classification Search
CPC ............. H05K 3/10; H05K 3/12; H02G 3/26; H01B 5/02
USPC .......................................... 307/112, 119, 147
See application file for complete search history.

(56) References Cited

U.S. PATENT DOCUMENTS 2,669,646 A 2/1954 Ford
2,964,587 A 12/1960 Minot
(Continued)

FOREIGN PATENT DOCUMENTS

GB 1601000 A 10/1981
JP 2001068907 A 3/2001
(Continued)

OTHER PUBLICATIONS

International Search Report and Written Opinion dated Apr. 30, 2010 received in Corresponding International PCT Application No. PCT/US2009/055678, filed Sep. 2, 2009.
(Continued)

*Primary Examiner* — Daniel Cavallari
(74) *Attorney, Agent, or Firm* — Lerner, David, Littenberg, Krumholz & Mentlik, LLP

(57) ABSTRACT

An electrically conductive element, including an insulator and a first conductor, is provided, which can be affixed to a second conductor consisting of conductive structural element, wherein the insulator is positioned between the first and second conductors to electrically isolate them. A power supply may be connected between the first and second conductors to provide power thereto, and an electrical device may be connected across the first and second conductors.

21 Claims, 6 Drawing Sheets

(51) Int. Cl.
*H05K 3/10* (2006.01)
*H01B 13/16* (2006.01)
*H01R 4/24* (2006.01)

(56) References Cited

U.S. PATENT DOCUMENTS

| | | | |
|---|---|---|---|
| 3,524,921 A | | 8/1970 | Wolf |
| 3,622,384 A | * | 11/1971 | Davey et al. ............... 428/201 |
| 3,710,355 A | | 1/1973 | McPherson |
| 3,763,307 A | | 10/1973 | Wolf |
| 3,781,567 A | * | 12/1973 | Papsco ........................ 307/147 |
| 4,143,931 A | | 3/1979 | Skare et al. |
| 4,401,962 A | | 8/1983 | Su et al. |
| 4,460,804 A | | 7/1984 | Svejkovsky |
| 4,552,990 A | | 11/1985 | Persson et al. |
| 4,582,575 A | | 4/1986 | Warren et al. |
| 5,189,412 A | * | 2/1993 | Mehta et al. ............... 340/12.24 |
| 5,385,785 A | | 1/1995 | Lovell |
| 5,629,073 A | | 5/1997 | Lovell |
| 6,080,935 A | | 6/2000 | Lanoue et al. |
| 6,492,588 B1 | | 12/2002 | Grandy |
| 6,492,595 B2 | * | 12/2002 | Sexton ....................... 174/117 F |
| 6,501,525 B2 | | 12/2002 | Huang et al. |
| 6,667,435 B1 | | 12/2003 | French et al. |
| 6,974,913 B2 | | 12/2005 | Bahlmann et al. |
| 7,357,884 B2 | | 4/2008 | Fujii et al. |
| 2004/0035306 A1 | * | 2/2004 | Onishi et al. ................ 101/123 |
| 2005/0003855 A1 | * | 1/2005 | Wada et al. ................ 455/552.1 |
| 2005/0109522 A1 | | 5/2005 | Ysbrand |
| 2005/0236603 A1 | * | 10/2005 | Faris ............................. 252/500 |
| 2006/0269721 A1 | | 11/2006 | Finkel et al. |
| 2007/0073946 A1 | | 3/2007 | Conil et al. |
| 2007/0151748 A1 | | 7/2007 | Ziegler et al. |
| 2008/0090431 A1 | | 4/2008 | Patterson et al. |
| 2008/0198584 A1 | | 8/2008 | Fouraux et al. |
| 2010/0126090 A1 | | 5/2010 | Liang et al. |
| 2010/0170616 A1 | | 7/2010 | Boss et al. |
| 2010/0170702 A1 | | 7/2010 | Boss et al. |

FOREIGN PATENT DOCUMENTS

| | | |
|---|---|---|
| KR | 10-0209263 B1 | 7/1999 |
| WO | 2006123335 A2 | 11/2006 |

OTHER PUBLICATIONS

International Search Report and Written Opinion for International Application No. PCT/US2009/055681 dated Mar. 31, 2010.
Dow Corning Corporation, Material Safety Data Sheet, Dow Corning (R) PI-2000 Highly Conductive Silver Ink, 2005, pp. 1-9.
International Search Report and Written Opinion for Application No. PCT/US2009/055684 dated Apr. 13, 2010.
Definition of "Dielectric" from dictionary.com, retrieved on Mar. 10, 2014.

\* cited by examiner

ELECTRICALLY CONDUCTIVE ELEMENT, SYSTEM, AND METHOD OF MANUFACTURING

This application claims the priority of U.S. Provisional Application No. 61/093,789, filed Sep. 3, 2008.

BACKGROUND OF THE INVENTION

Field of the Invention

The present invention relates generally to the field of electrically conductive elements, and more particularly to a conductive coating applied on an insulator and over a conductive structural element to facilitate a circuit.

Electrical wiring in houses, buildings, airplanes, trains, boats, motor vehicles, and the like are conventionally installed in dedicated locations and terminated in standardized receptacles which are difficult to either relocate or supplement without substantial modification to the respective structure. For example, relocating a chandelier from one location in a house will likely require an electrician to relocate the electrical wiring connections above the ceiling to the desired new location for the chandelier. Similarly, lighting or speaker location in a vehicle or airplane may not be adequately positioned due to reconfiguration of seating. Modification to the airplane's or vehicle's wiring to accommodate a new lighting or speaker placement would likely be expensive and difficult.

Moreover, electrical conductive materials are usually present in houses, buildings, airplanes, trains, boats, motor vehicles, and the like, but are used to provide structure, and not to conduct electrical power or signals. For example, a conventional suspended ceiling grid contains a network of interconnected metallic inverted "T"-shaped beams which are used to suspend acoustical ceiling tiles, but not to conduct electrical power or signals. Similarly, the interior compartment of an airplane, motor vehicle, or building may contain a steel framework to provide structure (or trim), but not to conduct electricity. It is desired to take advantage of these inherently conductive structural elements and use them to conduct electricity or other electrical signals, and thereby provide a multitude of easily accessible connection points for electrical devices.

SUMMARY OF THE INVENTION

In a first embodiment of the present invention, an electrically conductive element (the first conductor) is affixed to a conductive structural element (the second conductor), such as the trim of a motor vehicle or a beam of a suspended ceiling grid, with an insulator positioned between the first and second conductors. The first conductor may be comprised of an electrically conductive coating, such as a conductive ink. The insulator may be printed on the second conductor, and the first conductor may be printed on the insulator. The first conductor may be formed as a film, which in turn is applied to the insulator. Alternatively, the insulator and first conductor may be formed together as film, which in turn is applied to the second conductor, for example, as a retrofit to an existing second conductor.

In another embodiment of the present invention, a method of making an electrically conductive element is provided, which includes the steps of providing a first conductor, applying an insulator to a portion of the first conductor, and mechanically fastening (such as by crimping) the first conductor to a second conductor, such that the insulator is positioned between the first and second conductor.

In still another embodiment of the present invention, a method of making an electrically conductive element, by retrofitting an existing conductive structural element (second conductor), is provided. The method includes applying an insulator to the second conductor and applying a first conductor on the insulator. The insulator may be printed on the second conductor, and the first conductor may be printed on the insulator.

In still another embodiment of the present invention, an electrically conductive system is provided. The system includes a plurality of first and second conductors, where the second conductors are electrically connected to each other in the network and the first conductors are electrically connected to each other in the network. An insulator is positioned between each of the first and second conductors. The electrical system may also include a power supply, in which a positive side is connected to the first conductors and a negative side is connected to the second conductors, or vice versa, to provide power to electrical devices connected across the first and second conductors.

BRIEF DESCRIPTION OF THE DRAWINGS

Other features of example embodiments of the invention will be more readily understood from the following detailed description of specific embodiments thereof when read in conjunction with the accompanying drawings, in which.

DETAILED DESCRIPTION OF THE PREFERRED EMBODIMENTS

In order to overcome the problems discussed above, an electrically conductive element is provided. This element can be applied to a preexisting conductive structural element, such as that used in a suspended ceiling grid or a vehicle framework, to form an electrical network that can be used for a variety of purposes, including but not limited to low-voltage power distribution. The electrical network has a multitude of connection points, so electrical devices may be placed in almost any desired location of a home, building, vehicle, plane, train, boat, etc.

Figure 1:
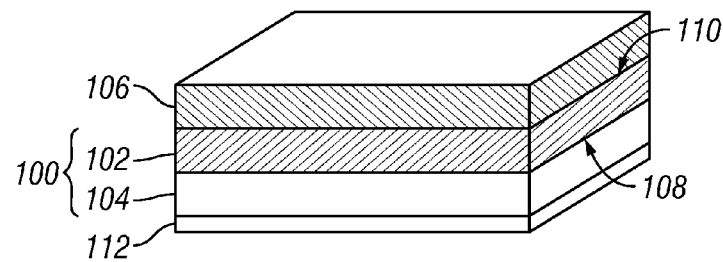
FIG. 1 shows an electrically conductive element in accordance with an embodiment of the invention.

FIG. 1 shows an embodiment of an electrically conductive element 100 connected or applied to a second conductor 106.

The conductive element is comprised of an insulator 102 and a first conductor 104. The insulator 102 is shown as a planar member (or layer) having first 108 and second sides 110. While shown in FIG. 1 as a planar member, it should be noted that the insulator 102 may be formed in other shapes, such as a curved surface.

The insulator 102 is typically dielectric and may be formed from conventional insulative materials such as ceramics, porcelain, plastics, glass, rubber, Teflon, paper, fiber, or the like. While specific types of insulative materials are mentioned it is to be understood that this list is not exhaustive of suitable materials which would be appreciated by one of ordinary skill in the art.

The insulator 102 is preferably applied to the first conductor 104 by spraying, laminating or printing thereon. The thickness of the insulator 102 is sufficient to provide electrical isolation of a predetermined amount between the first and second conductor, typically 0.5 microns or higher, and preferably 5 microns.

The first conductor 104 is connected to at least a portion of the first side 108 of the insulator 102. The first conductor 104 may be connected to the insulator 102 by conventional mechanical techniques, such as by fastening with screws, nails, snap closure, crimping, or the like. Alternatively, the first conductor 104 may be connected to the insulator 102 by an adhesive or other chemical bonding material. The conductor 104 may be a conventional metal conductor or any suitable material capable of conducting an electrical signal. The first conductor 104 may also be comprised of a substrate that is coated with a conductive coating, such as a conductive paint 112. The conductive element 100 comprised of the insulator 102 and the first conductor 104 may be configured to be flexible, so it can be applied to curved surfaces or in or around corners, etc. In this case, the first conductor 104 and the insulator 102 material must be flexible.

The second side 110 of the insulator is affixed to the second conductor 106, that is, the conductive structural element. When the positive and negative sides of a power supply are respectively connected to the first 100 and second conductors 106, and a load (for example, a lighting fixture) is connected across the first conductor 104 and second conductor 106, electric current will be transferred through the first and second conductors to the load (See, e.g., FIGS. 7 and 8).

Figure 2:
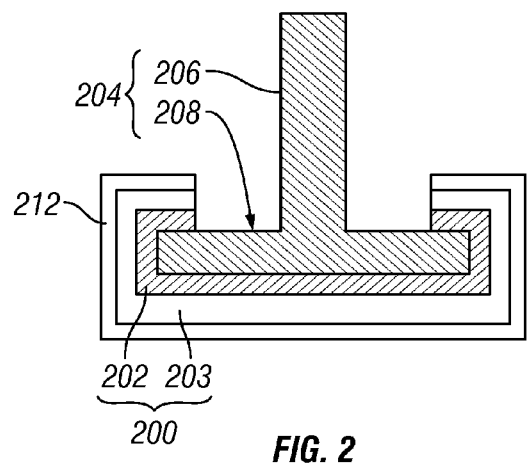
FIG. 2 shows an electrically conductive element formed as a coil in accordance with an embodiment of the invention.

FIG. 2, shows a conductive element 200 including a first conductor 203 and an insulator 202 like the first conductor 104 and insulator 102 of FIG. 1, preferably formed in the shape of a conductive coil. The conductive coil or element 200 can be configured to attach to, through the insulator 202, to a second conductor 204 formed as a beam, having a cross section in the form of an inverted T. The beam 204 includes a vertical web 206 and a transverse flange 208 connected at the bottom edge of the web 206. The beam 204 may be used, for example, to suspend ceiling tiles in a suspended ceiling grid in commercial or residential spaces.

The conductive element 200 shown in FIG. 2 can be formed in various ways. For example, the first conductor 203 may be formed as an extruded, rolled, molded, or sintered metallic coil element having a concave surface (facing the insulator 202) and an outer convex surface. The concave surface may be coated with an insulative material such as by spraying or printing, and the convex surface may be coated with a conductive coating, such as conductive ink or paint 212. The conductive paint or ink 212 applied over first conductor may come in a variety of colors and textures.

Instead of coating the concave side of the metallic first conductor coil 203 with an insulating material, an insulator member 202 may be positioned in the concave channel formed by the first conductor coil 203. This insulator member 202 may be non-coated and either affixed to the concave surface (as discussed above with respect to the conductive element of FIG. 1) or allowed to slide freely in the concave channel of the first conductor coil 203. In the latter case, the coil 200 may be configured such that when pressure is applied between the flange 208 of the beam 204 and the first conductor 203, the sliding movement of the insulator 202 with respect to the flange 202 is minimized or prevented.

Alternatively, the element 200 may be constructed from an extruded, rolled, or cast insulator 202 formed having a concave surface facing the flange 208 of the second conductor 204. The outer convex surface of this curved insulator 202 may be coated with a conductive coating, such as a conductive paint or conductive ink. Alternatively, the first conductor 203 may be a metallic element, such as a metallic foil, mechanically connected to the curved insulator 202, such as for example by crimping, snapping, or other conventional fastening means.

The conductive element 200 in FIG. 2 may be flexible to conform to the shape of the structure to which it attaches, such as the second conductor 204. In one embodiment, the conductive coil 200 is configured to be crimped to the flange 208 of the ceiling beam 204 such that the insulator 202 is in physical contact with the second conductor 204 and remains positioned between the first 204 and second conductors 204 to electrically isolate them.

Figure 3:
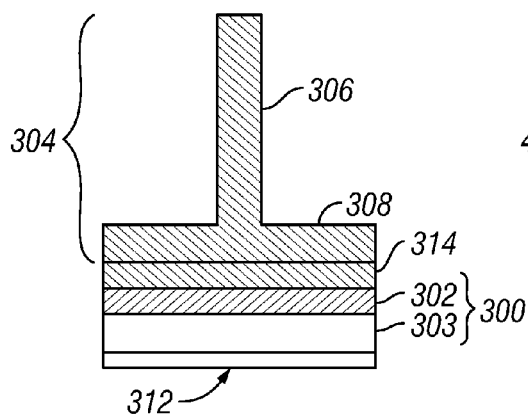
FIG. 3 shows a conductive element applied to an inverted T beam in accordance with an embodiment of the invention.

FIG. 3 shows yet another embodiment of the conductive element of FIG. 1 as applied to an inverted T beam 304 shown that is used as a second conductor. The T beam 304 includes a vertical web 306 connected at its lower edge to a transverse flange 308, which is connected to a cap 314, which can be a metallic element. In this embodiment, the conductive element 300 (comprised of an insulator 302 and a first conductor 303) is affixed to the cap 314 at the side of the insulator 302 not affixed to the first conductor 303. The conductive element 300 may be applied to the cap 314 by various methods including, but not limited to, a mechanical fastener, a snap fit connection, adhesive, or the like. Alternatively, the insulator 302 can be applied to the cap 314 of the second conductor 304 by spraying an insulative coating or printing an insulative ink. The first conductor 303 can be likewise applied onto an insulator (coated or otherwise) by spraying a conductive coating such as a conductive paint or conductive ink.

In addition, the conductive element 300 shown in FIG. 3 may take the form of a conductive film or tape which can be attached to the ceiling beam 304 after the ceiling grid has been installed. In this way, the conductive element 300 may be used to retrofit existing ceiling beams 304 to be used as second conductors, such as, for example, to form a power transmission system. The conductive film or tape can be applied to the surface of the vertical web 306, the exterior of the cap 314, the exterior of the transverse flange 308 of the inverted T beam 304, or any combination thereof. Also, the conductive elements 300 corresponding to the different polarities carried by each element can be disposed on separate films or tapes or as parallel traces on the same strip of film or tape.

Figure 4:
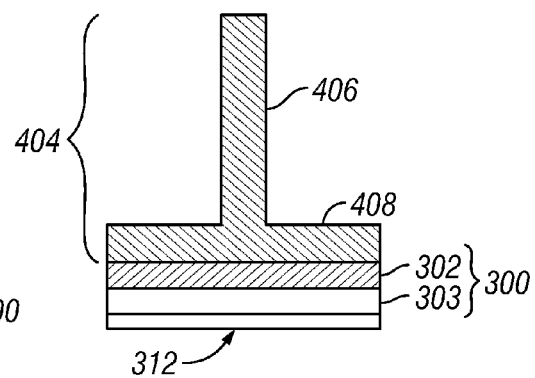
FIG. 4 shows a conductive element applied to an inverted T beam in accordance with an embodiment of the invention.

FIG. 4 shows a variation of the conductive element 300 in FIG. 3, wherein the conductive element 300 is also applied to a ceiling beam. In FIG. 4 the inverted T beam 404 is constructed similarly as the inverted T beam 304 shown in FIG. 3, except that the cap 314 is not present. In such an embodiment the conductive element 300 can be applied directly to the flange 408 of the beam.

Although the conductive element has been described in connection with a ceiling grid, it is within the scope of the invention that these and any other embodiments of the conductive element described herein are applicable to second conductors that take other forms, such as metallic structural or trim members in airplanes, cars, boats, buildings, etc. Some examples of metallic members for use in buildings are drywall ceiling grid, metallic drywall corner bead, metallic drywall studs, and metallic ceiling components such as utility trays, ceiling panels and other members that are known in the art. Moreover, a conductive element can be applied to a polymeric or other support material that are not necessarily made with metal, such as polymeric ceiling grid, chair rails, base boards, crown molding and other trim pieces.

Figure 5:
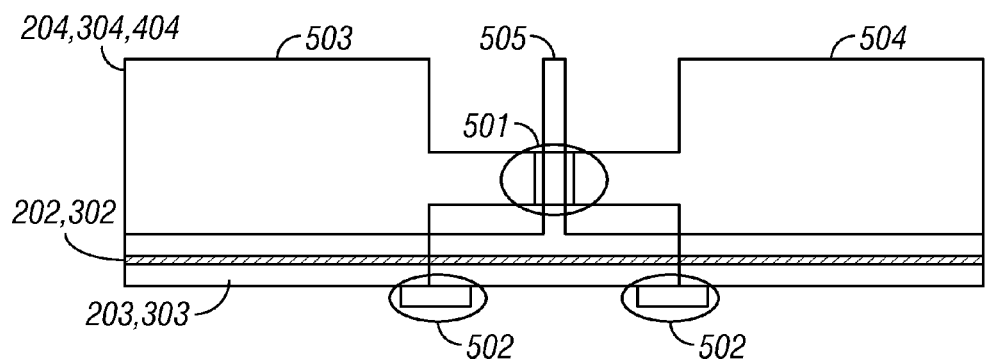
FIG. 5 shows a side view of inverted T beams connected together in accordance with an embodiment of the invention.
Figure 6:
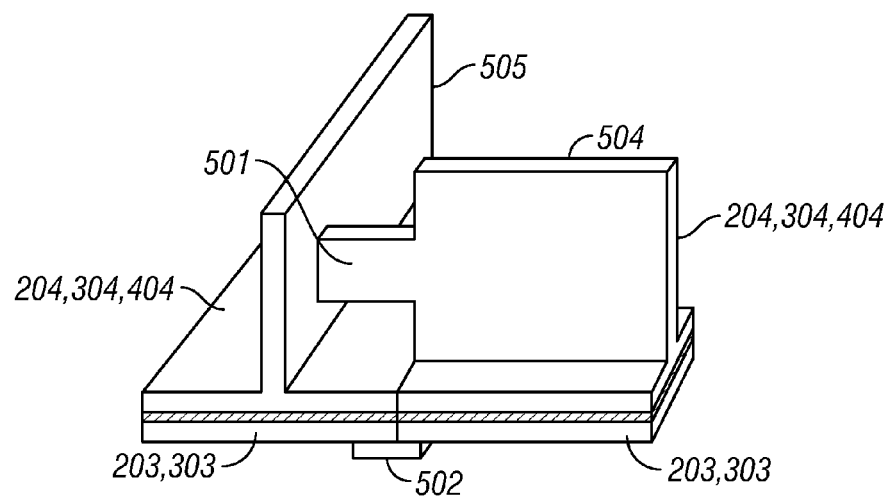
FIG. 6 shows an isometric view of inverted T beams such as those shown in FIG. 5.

The first and second conductors 203, 303, 303 and 204, 304, and 404, respectively, shown in FIGS. 2-4 can be connected to each other by contacts 501, 502 connected to respective portions thereof. As shown in FIG. 5, three beams 503, 504, 505 are connected together via contacts 501, 502. A first beam 503 and a second beam 504 (leftmost and rightmost beams, respectively) each include a connector 501 in electrical and mechanical contact with the vertical web of a center beam 505, which is perpendicular to the first and second beams 503, 504. Likewise, contacts 502 extend from below the first conductor 203, 303 of each of the first and second beams 503, 504. The contacts 502 extend from below the first conductor 203, 303 toward each other under the first conductor of the center beam 505. The contacts 502 of the first conductor 203, 303 are configured to electrically and mechanically contact the first conductor 203, 303 of the center beam 505. FIG. 6 shows an isometric view of the center beam 505 and rightmost beam 504 connected together as shown in FIG. 5. By virtue of such contacts 501, 502 between the beams 504, 505, a plurality of beams can be configured as a conductive grid which can be energized or otherwise used to transmit electrical signals through the first and second conductors 203, 303 and 204, 304, 404, respectively.

In another aspect of the invention, an electrically conductive system is provided. In one embodiment a plurality of conductive elements is provided, each comprised of an insulator having at least a first and a second portion. Each conductive element has a first conductor connected to a first side of the insulator and a second conductor connected to the second side of the insulator, as described above.

Figure 7:
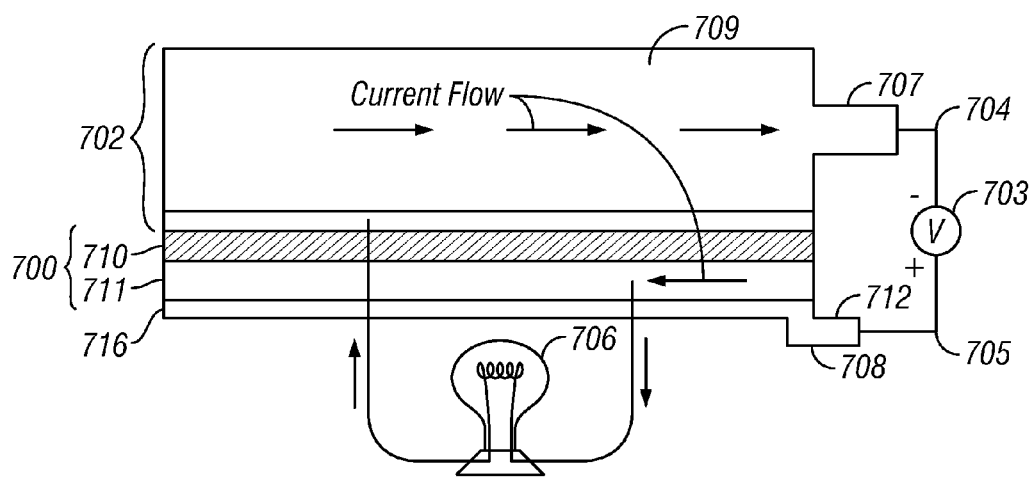
FIG. 7 shows a schematic of a circuit that includes a conductive element connected to a voltage supply and a device in accordance with an embodiment of the invention.

In the embodiment shown in FIG. 7, a system of conductive elements 700 and second conductors 702 is connected to a power supply 703. The positive 705 and negative 704 sides of the power supply 703 are connected respectively to the first conductor 711 and second conductor 702 to transmit power to devices 706 that are connected across the first and second conductors. FIG. 7 shows a second conductor 702, like the beam shown in FIG. 4, having a contact 707 extending from an edge of the vertical web 709, similar to the configuration shown in FIGS. 5 and 6. Likewise, the first conductor 711 includes a contact 708 extending from below the first conductor 711 having a top surface 712 that is substantially coplanar with the bottom surface of the first conductor 711 (inclusive of any coating 716). A device 706, such as a light fixture, is connected across the first and second conductors, 711, 702, respectively. When a voltage is applied across the first and second conductors 711, 702, current flows from the first conductor 711, through the device 706, and to the second conductor 711, to complete the circuit. While such a circuit has been described with reference to a light fixture, it will be appreciated that other electrically powered devices 706 can be electrically connected to the first and second conductors 711, 702, such as, but not limited to, electrical receptacles, video cameras, fans, motors, heating elements, switches, sensors, scanners, and antennas. Alternatively, by virtue of the interconnection of the beams as shown in FIGS. 5 and 6, a network or grid of such conductive elements 700 and second conductors 702 can transmit analog or digital electrical signals, for example, audio signals to a speaker connected to the first and second conductors. Further, the electrical ground may be connected to the inverted T beam to utilize the building infrastructure as the ground circuit for a single or multiple grid connection.

Figure 8:
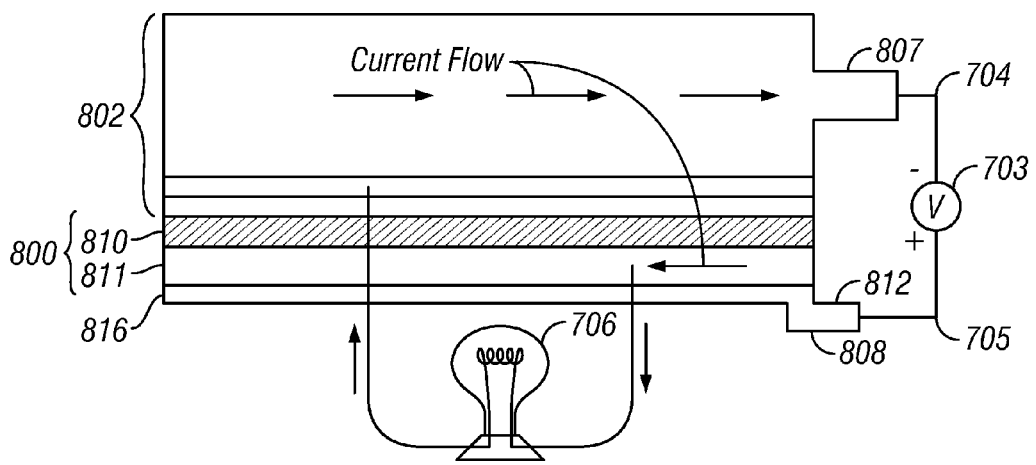
FIG. 8 shows a schematic of a circuit that includes the conductive element connected to a voltage supply and a device in accordance with an embodiment of the invention.

FIG. 8 shows another version of a system of conductive elements 800 and second conductors 802 is connected to a power supply 703 as in the system shown in FIG. 7, except that the second conductor 802 is configured like that shown in FIG. 3, and where the first conductor 811 includes a contact 808 extending from below the first conductor 811 having a top surface 812 that is substantially coplanar with the bottom surface of the first conductor 811 (inclusive of any coating 816).

Figure 9:
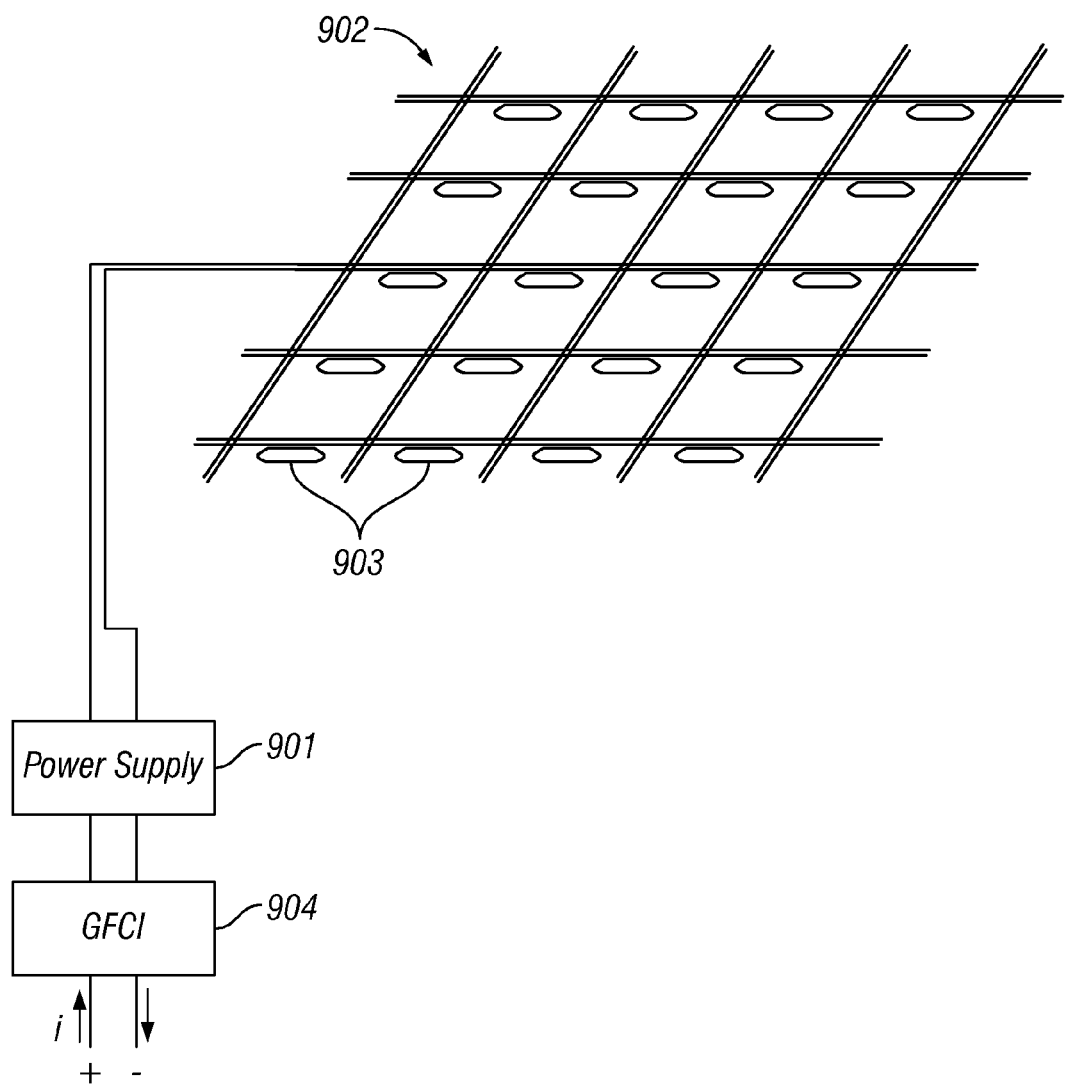
FIG. 9 shows a schematic of a power supply connected to an electrically conductive grid and GFCI circuit.

FIG. 9 shows a power supply 901 connected to a grid 902 of beams connected to applied conductive elements, such as those shown in FIGS. 2-4. The first and second conductors can be electrically and mechanically connected as shown in FIGS. 5 and 6. Devices 903, such as light fixtures are connected to the beam (i.e., second conductor) and the first conductor of the conductive element, draw power from the power supply 901 connected to the grid so as to provide overhead lighting.

Optionally, a ground fault circuit interrupter (GFCI) 904 may be connected upstream or downstream of the power supply 901. A GFCI 904 constantly monitors electricity flowing in a circuit to sense any loss of current. If the current flowing through the circuit differs by a small amount from that returning, the GFCI 904 quickly switches off power to that circuit. A GFCI may be useful if power was to be applied to a conductive element in an area of an occupancy near a source of water, such as a kitchen or bathroom, or any other such location of an occupancy where such devices are required by building code. Further, a touch switch or any other known electrical switch may be connected in the circuit, in series or in parallel, to provide on/off capability.

Figure 10:
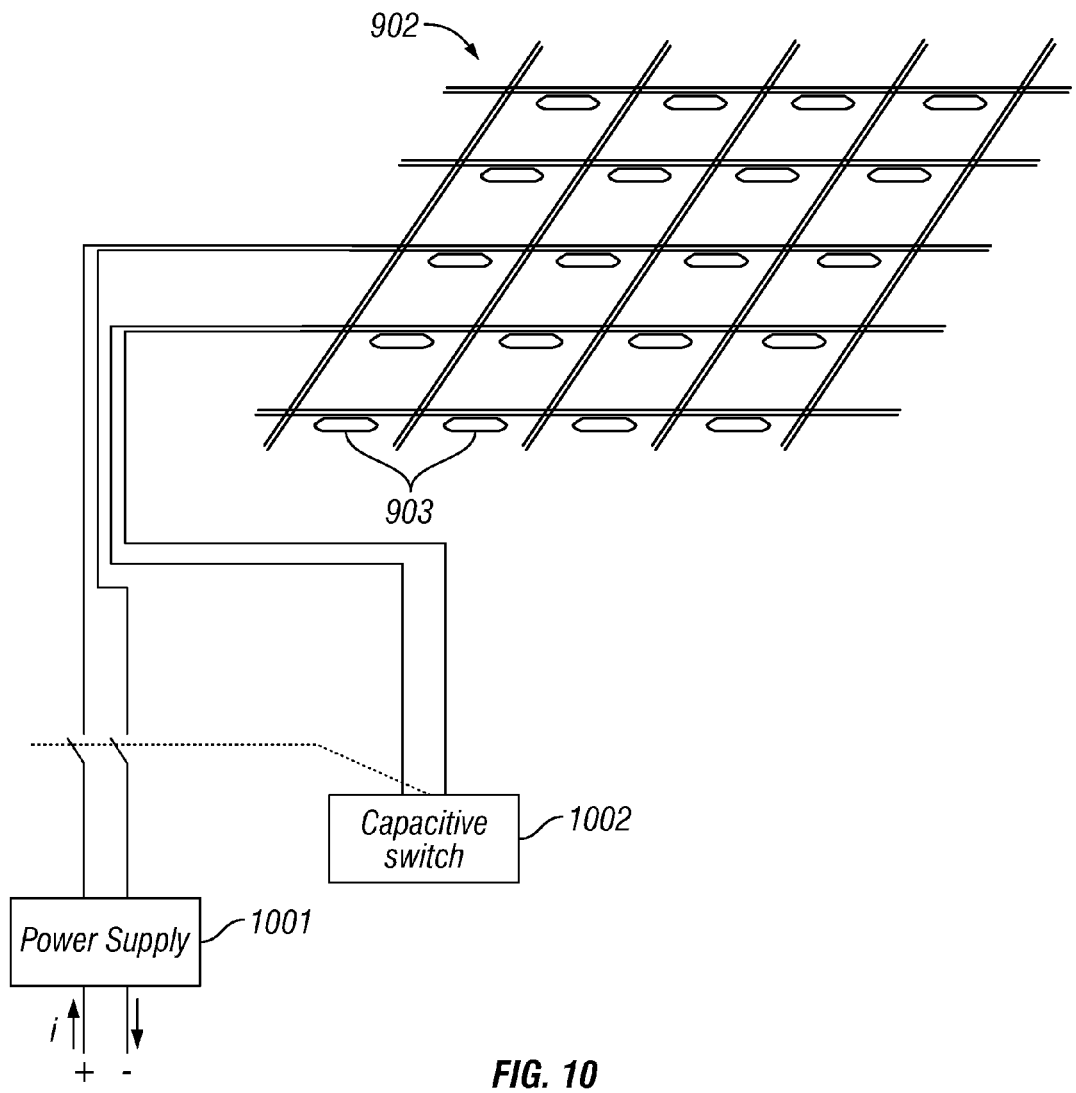
FIG. 10 shows a schematic of a power supply connected to an electrically conductive grid and a capacitive switch.

FIG. 10 shows another embodiment of a system of conductive elements, in which the conductive grid is connected to a power supply 1001 and a capacitive switch 1002 to form a capacitance interrupt circuit, which acts as a protection circuit if the grid connection to the power is interrupted.

References have been made above with respect to devices which may attach to various embodiments of the conductive element and the conductive system. Such devices may connect by mechanical means, such as by snap fit connection, twisting, clamping, soldering, and fastening. In addition devices may attach by adhesive force. An example of such a device is a lighting fixture 1101 shown in FIG. 11. The light fixture 1101 includes a housing 1102 that houses lamps 1103 and wiring (not shown) connected to clips 1104 and/or a contact 1105. The clips 1104 mechanically and electrically connect the lamps 1103 to the conductive element and the second conductor. The two clips 1104 shown are configured to attach to a ceiling beam connected to a first conductor like those shown in FIGS. 2-4. In one embodiment, one of the clips is fixed with respect to the housing 1102 while a second clip is hinged so as to rotate away from the housing 1102 during installation and removal. In such an embodiment, the hinged clip can be rotated away from the housing 1102 during installation and removal of the fixture while the curved edge of the first fixed clip engages one edge of the first conductor. The housing 1102 can, in the case of installation, be rotated toward the inverted T beam so as to engage the second hinged clip on the opposite side of the first conductor, which may be verified by an audible snap or click.

Figure 11:
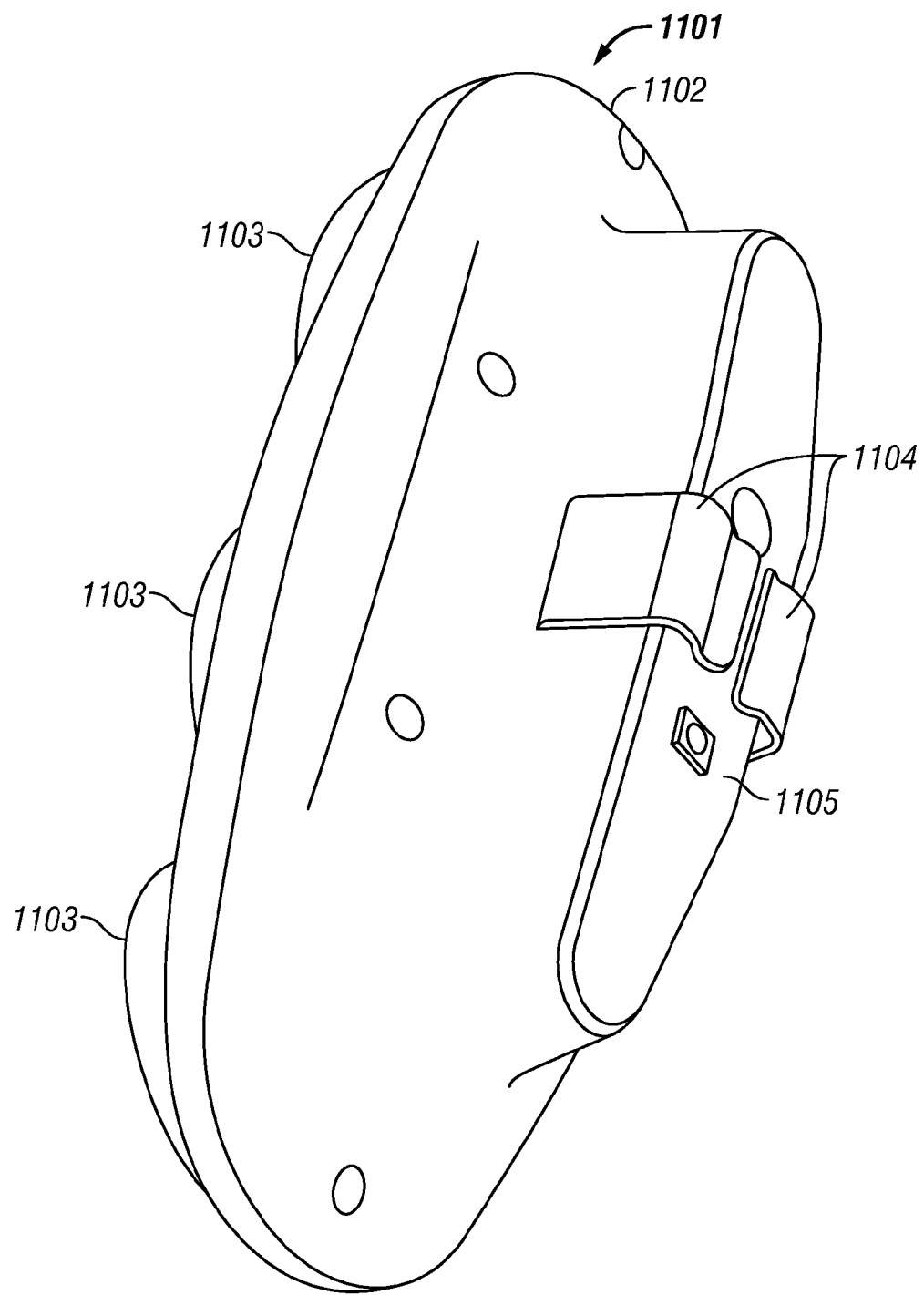
FIG. 11 shows an embodiment of a lamp which may be connected to an electrically conductive grid.

As shown in FIG. 11, at least one of the clips is configured to electrically contact the second conductor of the vertical web of the beams shown in FIGS. 2-4. Also shown in FIG. 11 the electrical contact 1105 is formed as a raised bump contact extending from the surface of the housing 1102. When the housing 1102 is connected to the beam and the conductive element, the clips 1104 secure the housing 1102 to the conductive element in such a way so as to electrically connect the raised contact 1105 of the housing 1102 with the first conductor. Thus, by virtue of the raised bump 1105 contact and the clips, a voltage applied across the first and second conductors of the conductive element and beam, respectively, can be used to power the lamps 1103. Of course, devices other than lamps can be connected using the clip/tab configuration shown in FIG. 11, and other connection means may be possible in addition to that exemplary embodiment shown therein.

What is claimed is:

1. An electrically conductive element comprising:
an insulator having first and second sides;
a first conductor connected to the first side of the insulator; and
a second conductor connected to the second side of the insulator, the second conductor formed as a structural support member of an apparatus,
wherein the second side of the insulator is printed or coated on the second conductor.

2. The conductive element according to claim 1, wherein the second side of the insulator is printed on the second conductor.

3. The conductive element according to claim 2, wherein the first conductor is printed on the first side of the insulator.

4. The conductive element according to claim 1, wherein the first conductor is comprised of an electrically conductive coating.

5. The conductive element according to claim 4, wherein said electrically conductive coating is comprised of conductive ink.

6. The conductive element according to claim 1, wherein the first conductor is printed on the first side of the insulator.

7. The conductive element according to claim 1, wherein the insulator and first conductor are formed as a film.

8. The conductive element according to claim 7, further comprising an adhesive layer applied to the second side of the insulator.

9. A method of making an electrically conductive element comprising the steps of:
providing a second conductor formed as an electrically conductive member selected from the group consisting of a ceiling grid, drywall corner bead, drywall studs, utility tray, chair rails, base boards and crown molding;
applying an insulator to the second conductor; and
applying a first conductor to the insulator,
wherein the applying the insulator step includes printing or coating the insulator onto the second conductor.

10. The method according to claim 9, wherein the applying the insulator step includes printing the insulator on the second conductor.

11. The method according to claim 9, wherein the applying the first conductor step includes printing the first conductor on the insulator.

12. A method of making an electrically conductive element comprising the steps of:
providing a first conductor;
applying an insulator to one side of the first conductor, wherein applying the insulator includes printing or coating the insulator onto said one side of the first conductor; and
connecting the first conductor to a second conductor formed as a metallic structural member selected from the group consisting of a ceiling grid, drywall corner bead, drywall studs, utility tray, chair rails, base boards and crown molding,
wherein the insulator is positioned between the first and second conductor to electrically isolate them.

13. The method according to claim 12, wherein connecting the first conductor includes crimping the first conductor and insulator onto the second conductor.

14. A method of making an electrically conductive element comprising the steps of:
providing a second conductor, the second conductor formed as a structural trim member;
applying an electrically conductive film to the second conductor, the film comprising:
an insulator having first and second sides; and
a first conductor connected to the first side of the insulator, wherein the second side of the insulator connects to the second conductor, and wherein the insulator is printed or coated onto the second conductor.

15. An electrically conductive system comprising:
a plurality of conductive elements, each comprised of an insulator having first and second sides and a first conductor connected to the first side of the insulator;
a plurality of second conductors respectively connected to the second side of each of the insulators, wherein at least one of the insulators is printed or coated onto its respective second conductor; and
a plurality of support beams in a building, the plurality of support beams arranged to form one or more of the plurality of second conductors.

16. The electrical conductive system of claim 15, further comprised of a power supply, with one side of the power supply connected to one of the first conductors, and another side of the power supply connected to one of the second conductors.

17. The electrical conductive system of claim 16, further comprised of a capacitive switch connected in series between the power supply and the first and second conductors.

18. The electrical conductive system of claim 15, wherein the first conductors of the conductive elements interlock with each other and the second conductors of the conductive elements interlock with each other.

19. The conductive element of claim 1, wherein the structural support member of the apparatus is selected from the group consisting of a metallic trim member in an airplane, boat, building and a car.

20. The conductive element of claim 1, wherein the structural support member of the apparatus is selected from the group consisting of a ceiling grid, drywall corner bead, drywall stud, utility tray, ceiling panel, chair rails, base boards, and crown molding.

21. The conductive element of claim 1, wherein the insulator and first conductor are formed as a coil.

* * * * *